United States Patent
Hirata et al.

(10) Patent No.: US 11,942,708 B2
(45) Date of Patent: Mar. 26, 2024

(54) CRIMP TERMINAL-EQUIPPED FLEXIBLE PRINTED CIRCUIT BOARD AND METHOD FOR MANUFACTURING SAME

(71) Applicant: NIPPON MEKTRON, LTD., Tokyo (JP)

(72) Inventors: Masanori Hirata, Tokyo (JP); Shunsuke Aoyama, Tokyo (JP); Yu Miura, Tokyo (JP); Kenji Kiya, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 214 days.

(21) Appl. No.: 17/454,948

(22) Filed: Nov. 15, 2021

(65) Prior Publication Data

US 2022/0294135 A1    Sep. 15, 2022

(30) Foreign Application Priority Data

Mar. 10, 2021 (JP) .................. 2021-038017

(51) Int. Cl.
*H01R 12/69* (2011.01)
*H01R 43/048* (2006.01)
*H05K 1/18* (2006.01)

(52) U.S. Cl.
CPC .......... *H01R 12/69* (2013.01); *H01R 43/048* (2013.01); *H05K 1/189* (2013.01); *H05K 2201/10333* (2013.01); *H05K 2201/10522* (2013.01); *H05K 2201/2009* (2013.01)

(58) Field of Classification Search
CPC ......... H05K 3/308; H05K 2201/10189; H05K 1/02; H05K 2203/0221; H05K 2203/0278; H05K 1/032; H05K 1/0346; H05K 1/18; H05K 3/0058; H05K 3/30; H01R 2107/00; H01R 12/68
See application file for complete search history.

(56) References Cited

FOREIGN PATENT DOCUMENTS

| JP | 4074047 B2 * | 4/2008 | |
| JP | 4889027 B2 | 2/2012 | |
| JP | 5465579 B2 | 4/2014 | |
| WO | WO-2016035292 A1 * | 3/2016 | ............... H05K 1/02 |

* cited by examiner

*Primary Examiner* — Jean F Duverne
(74) *Attorney, Agent, or Firm* — Studebaker & Brackett PC

(57) ABSTRACT

A crimp terminal-equipped flexible printed circuit board includes: a first flexible printed circuit board having a base film and a circuit provided on a surface of the base film and made of metal foil; multiple crimp terminals including crimp pieces crimped to penetrate the first flexible printed circuit board and bent to bite into part of the circuit; and an insulating reinforcing film partially integrally provided on an area of the base film where the multiple crimp pieces penetrate.

5 Claims, 9 Drawing Sheets

CRIMP TERMINAL-EQUIPPED FLEXIBLE PRINTED CIRCUIT BOARD AND METHOD FOR MANUFACTURING SAME

CROSS-REFERENCE TO RELATED APPLICATION

This application claims priority from Japanese Patent Application No. 2021-038017 filed with the Japan Patent Office on Mar. 10, 2021, the entire content of which is hereby incorporated by reference.

BACKGROUND

1. Technical Field

One aspect of the present disclosure relates to a crimp terminal-equipped flexible printed circuit board and a method for manufacturing the crimp terminal-equipped flexible printed circuit board.

2. Related Art

Electric components such as many electric parts are included in, e.g., an automobile, and many electric wirings are necessary. A typically-used wire harness has great weight and volume, and for this reason, a flexible printed circuit board (FPC) has been recently broadly utilized. Specifically, the demand for an electric automobile, a hybrid vehicle, and a fuel cell vehicle has been increased as environmental countermeasures, and for this reason, the demand for the FPC has been further increased. For the FPC, not only further improvement in weight reduction, size reduction, and bendability but also multi-functionalization by mounting of a sensor component and the like have been demanded.

For these reasons, tendency shows that a connector and a connection terminal for electrically connecting the FPC and various electric components (e.g., a sensing module, an ECU, and a battery) are also reduced in size. Also, tendency shows that a wiring on the FPC is narrowed and a clearance between wirings is narrowed. For the connection terminal, a crimp terminal easily attachable to the FPC has been broadly used. The crimp terminal can be attached to the FPC only by swaging of a crimp piece. However, the crimp terminal used for the FPC is configured to be in conduction with the wiring in such a manner that the crimp piece is bent to penetrate a base film and the wiring of the FPC. For this reason, if the connection terminal is reduced in size and the wiring is narrowed, it is difficult to maintain conduction and the strength of each member.

For ensuring the conduction, countermeasures such as an increase in the number of crimp pieces, an increase in the amount of push-in of the crimp piece, or an increase in the area of contact between the crimp piece and the wiring have been also taken. However, in this case, the mechanical strength of each member is easily degraded. The thicknesses of the base film and a cover film are increased so that the mechanical strength can be enhanced. However, in this case, the weight of the FPC increases, and the bendability thereof is degraded. Thus, there is still room for improvement.

SUMMARY

A crimp terminal-equipped flexible printed circuit board includes: a first flexible printed circuit board having a base film and a circuit provided on a surface of the base film and made of metal foil; multiple crimp terminals including crimp pieces crimped to penetrate the first flexible printed circuit board and bent to bite into part of the circuit; and an insulating reinforcing film partially integrally provided on an area of the base film where the multiple crimp pieces penetrate.

DETAILED DESCRIPTION

Figure 1A:
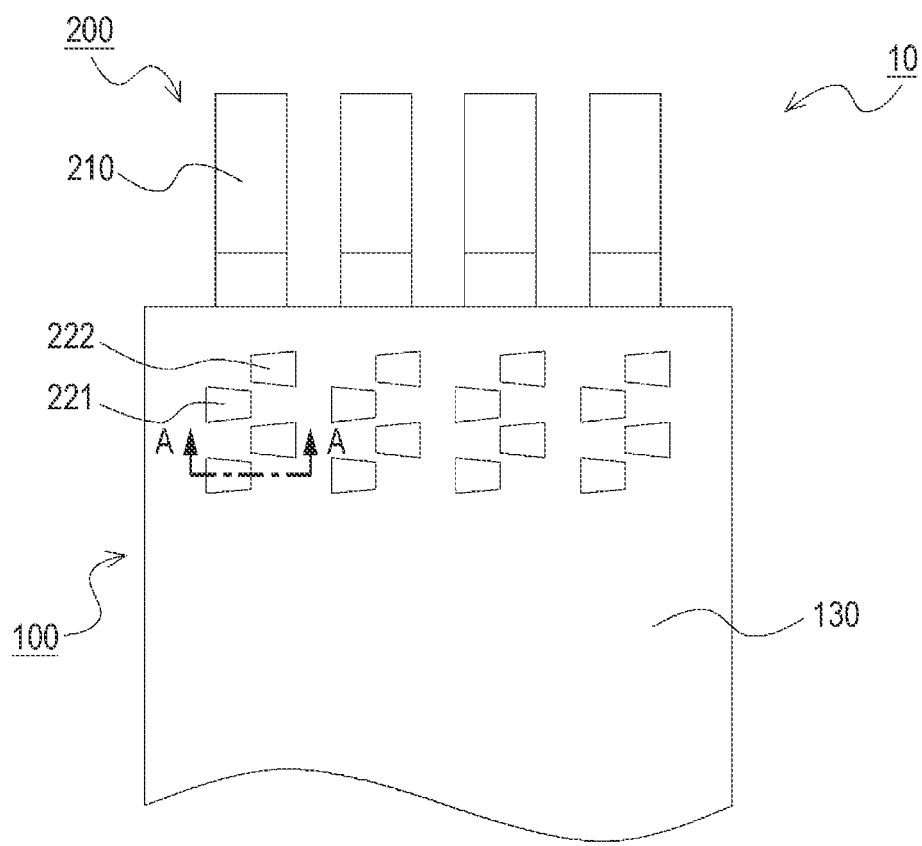
FIGS. 1A and 1B are schematic views of the configuration of a crimp terminal-equipped flexible printed circuit board according to a first embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One object of the present disclosure is to provide a crimp terminal-equipped flexible printed circuit board capable of making stable electrical connection while holding strength and a method for manufacturing the crimp terminal-equipped flexible printed circuit board.

A crimp terminal-equipped flexible printed circuit board according to one aspect of the present disclosure includes: a first flexible printed circuit board having a base film and a circuit provided on a surface of the base film and made of metal foil; multiple crimp terminals including crimp pieces crimped to penetrate the first flexible printed circuit board and bent to bite into part of the circuit; and an insulating reinforcing film partially integrally provided on an area of the base film where the multiple crimp pieces penetrate.

According to a first aspect of the present disclosure, the insulating reinforcing film is integrally provided on the base film. With this configuration, even when the crimp terminals are attached, the strength of the first flexible printed circuit board and the crimp terminal can be enhanced in the vicinity of the crimp pieces provided at the first flexible printed circuit board. The insulating reinforcing film is partially provided. With this configuration, an increase in the weight of the first flexible printed circuit board can be suppressed, and degradation of the bendability of the first flexible printed circuit board can be also reduced.

In the first aspect according to the present disclosure, the base film of the first flexible printed circuit board may be a single-sided copper-clad laminate made of polyimide, polyethylene naphthalate, or polyethylene terephthalate.

In the first aspect according to the present disclosure, the first flexible printed circuit board may have a cover film bonded to the base film to sandwich the circuit, in a partial area of the first flexible printed circuit board, part of the circuit may be exposed without the cover film being provided, and in the partial area, at least some of the multiple crimp pieces may bite into the part of the circuit without penetrating the cover film.

With this configuration, the area of contact between the crimp terminal and the circuit can be expanded.

A method for manufacturing a crimp terminal-equipped flexible printed circuit board according to a second aspect of the present disclosure includes: bonding an insulating reinforcing film to a predetermined area of a base film included in a first flexible printed circuit board; and swaging multiple crimp pieces included in crimp terminals to an area where the insulating reinforcing film is provided, thereby attaching the crimp terminals to the first flexible printed circuit board.

As described above, according to one aspect of the present disclosure, the crimp terminal-equipped flexible printed circuit board capable of making the stable electrical connection while holding the strength and the method for manufacturing the crimp terminal-equipped flexible printed circuit board can be provided.

Hereinafter, embodiments of the technique of the present disclosure will be exemplarily described in detail based on examples with reference to the drawings. Note that unless otherwise specified, the dimensions, materials, shapes, relative arrangement and the like of components described in these embodiments are not intended to limit the technical scope of the present disclosure to these dimensions, materials, shapes, relative arrangement and the like.

First Embodiment

Figure 1B:
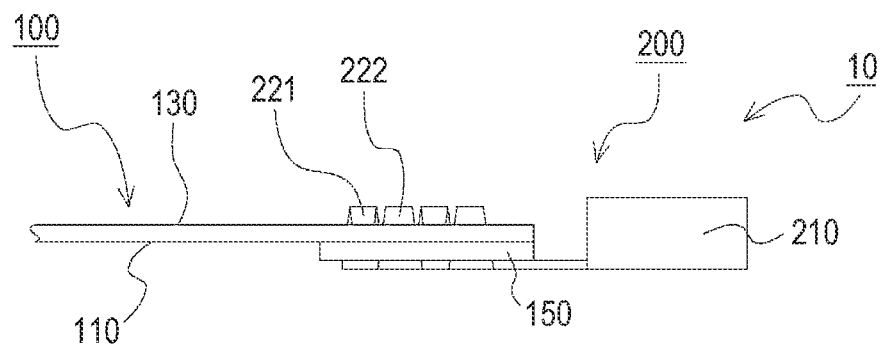
Figure 2A:
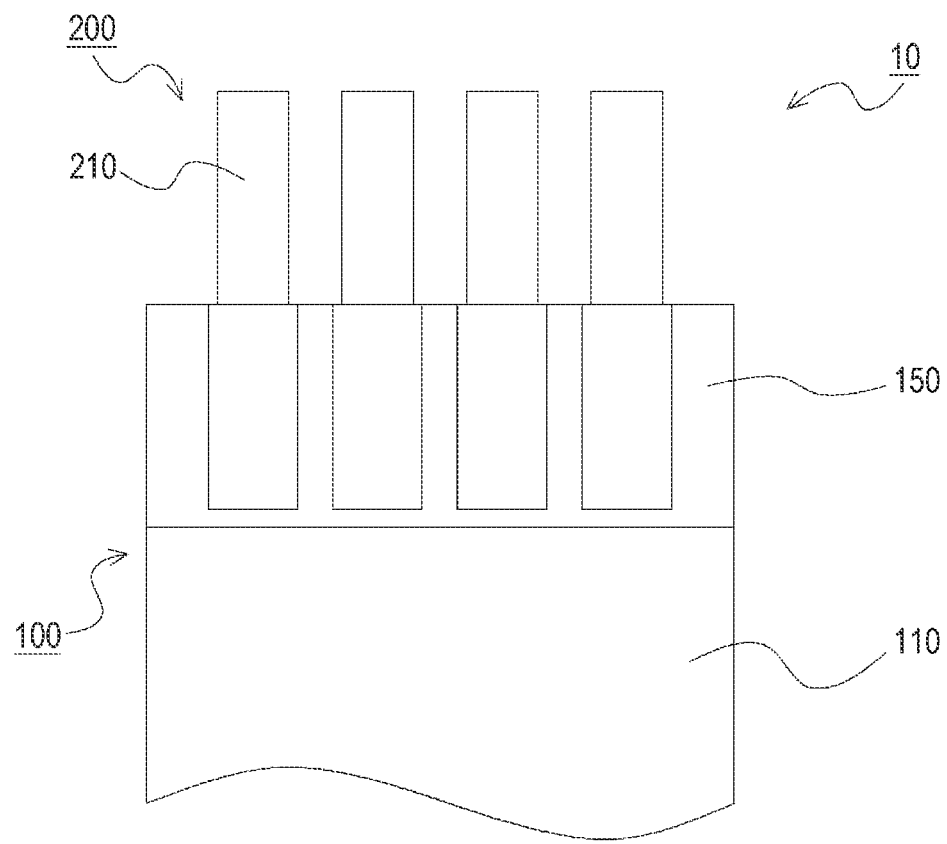
FIGS. 2A and 2B are schematic views of the configuration of the crimp terminal-equipped flexible printed circuit board according to the first embodiment of the present disclosure.
Figure 2B:
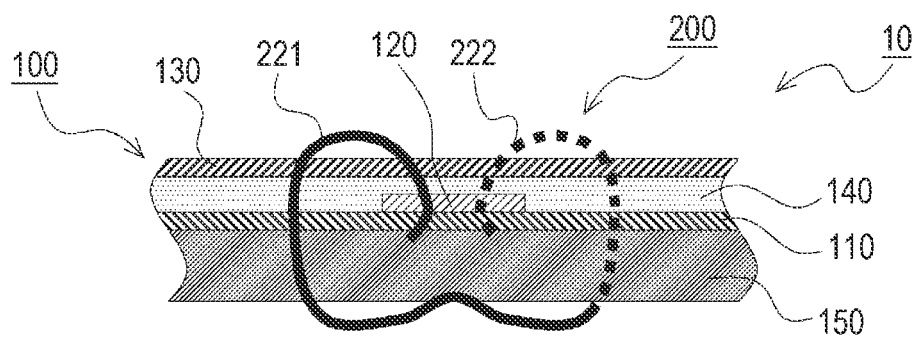
Figure 3A:
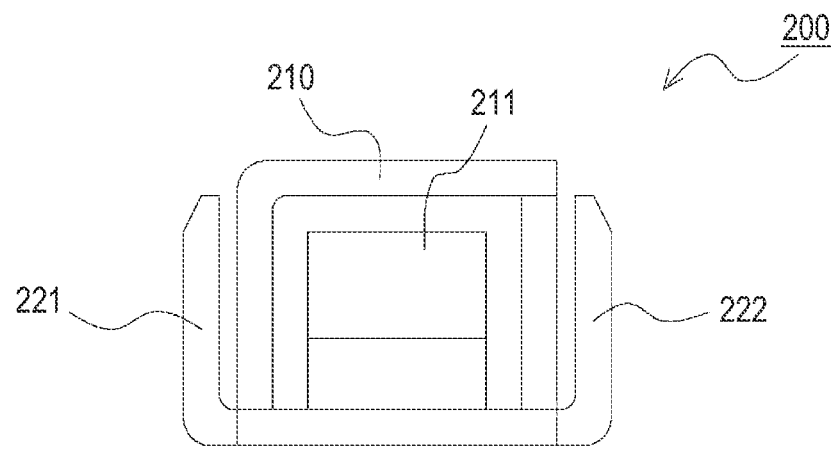
FIGS. 3A and 3B are schematic views of the configuration of a crimp terminal according to the first embodiment of the present disclosure.
Figure 3B:
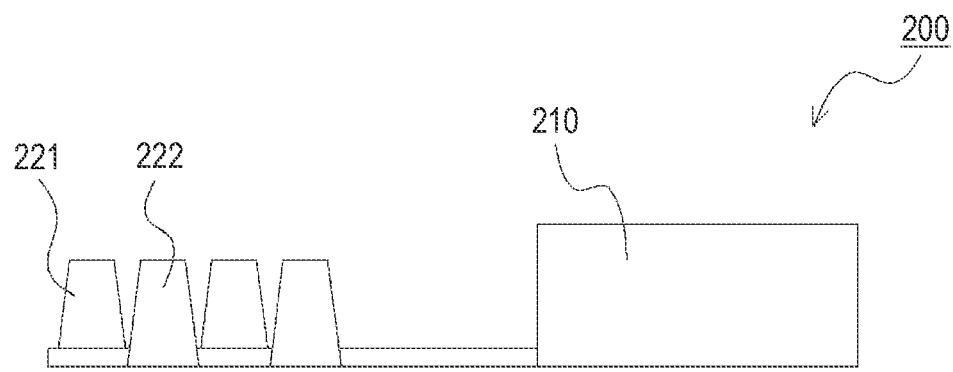

A crimp terminal-equipped flexible printed circuit board according to a first embodiment of the present disclosure will be described with reference to FIGS. 1A, 1B, 2A. 2B, 3A, and 3B. FIGS. 1A and 1B are schematic views of the configuration of the crimp terminal-equipped flexible primed circuit board according to the first embodiment of the present disclosure. FIG. 1A shows part of a plan view of the crimp terminal-equipped flexible printed circuit hoard. FIG. 1B shows part of a side view of the crimp terminal-equipped flexible printed circuit board. FIGS. 2A and 2B are schematic views of the configuration of the crimp terminal-equipped flexible printed circuit board according to the first embodiment of the present disclosure, FIG. 2A shows part of a back view of the crimp terminal-equipped flexible printed circuit board. FIG. 2B is a schematic sectional view of the crimp terminal-equipped flexible printed circuit board, and is a sectional view (not showing box portions of the crimp terminals) along an AA line in FIG. 1A. FIGS. 3A and 3B are schematic views of the configuration of the crimp terminal according to the first embodiment of the present disclosure. FIG. 3A shows a state in which the crimp terminal is viewed from a back end. FIG. 3B shows a side view of the crimp terminal. Note that FIGS. 3A and 3B show a state before the crimp terminal is crimped. On the other hand, FIGS. 1A, 1B, 2A, and 2B show a state after the crimp terminals have been crimped.

<Crimp Terminal-Equipped Flexible Printed Circuit Board>

The configuration of the crimp terminal-equipped flexible printed circuit board (hereinafter referred to as a "terminal-equipped FPC 10" as necessary) according to the present embodiment will be described. The terminal-equipped FPC 10 includes a flexible printed circuit board (equivalent to a first flexible printed circuit board, and hereinafter referred to as an "FPC 100") and crimp terminals 200 attached to the FPC 100.

The FPC 100 has a base film 110, a circuit 120 provided on a surface of the base film 110 and made of metal foil (e.g., copper foil), and a cover film 130 bonded to the base film 110 to sandwich the circuit 120. Note that an adhesive layer 140 for bonding the base film 110 and the cover film 130 to each other is formed between these films.

The FPC 100 according to the present embodiment includes an insulating reinforcing film 150. The insulating reinforcing film 150 is partially integrally provided on a predetermined area of the base film 110. The base film 110 is, for example, made of polyimide, polyethylene naphthalate, or polyethylene terephthalate. The FPC 100 configured as described above is called a single-sided copper-clad laminate in a case where the circuit 120 is made of copper foil.

The crimp terminals 200 are attached to the FPC 100 by a not-shown crimping tool or crimping equipment. In the example described in the present embodiment, four crimp terminals 200 are attached to the FPC 100, Note that the number of crimp terminals 200 to be attached to the FPC 100 varies depending on a product, needless to say.

In the present embodiment, a case where the crimp terminals 200 are female terminals is described. The crimp terminal 200 as the female terminal includes a box portion 210 into which a tip end portion of a male terminal is to be inserted and a tongue piece portion 211 for elastically sandwiching the tip end portion of the male terminal. Moreover, the crimp terminal 200 according to the present embodiment includes multiple crimp pieces 221, 222, The multiple crimp pieces 221, 222 are alternately arranged on both sides in a width direction (a direction perpendicular to a direction from a terminal tip end to a terminal back end). Note that in the configuration described in the present embodiment, four crimp pieces 221, 222 are provided. On this point, the number of crimp pieces 221, 222 can be set as necessary.

The crimp pieces 221, 222 are crimped to penetrate the FPC 100 and bent to bite into part of the circuit 120. In the present embodiment, the crimp terminal 200 is attached to the FPC 100 such that the crimp pieces 221, 222 pierce the FPC 100 from an insulating reinforcing film 150 side to a cover film 130 side. Note that in the present embodiment, various well-known crimp terminals each including these crimp pieces 221, 222 as described above can be employed as the crimp terminal 200. Moreover, in the present embodiment, a case where the crimp terminal is the female terminal is described. On this point, the crimp terminal 200 in the embodiment of the present disclosure can be also applied to a male terminal including similar crimp pieces.

<Method for Manufacturing Crimp Terminal-Equipped FPC>

Regarding the method for manufacturing the terminal-equipped FPC 10 including the crimp terminals 200, manufacturing steps will be sequentially described. First, the circuit 120 is formed in such a manner that part of metal foil provided on the surface of the base film 110, such as copper foil, is removed by etching. Next, the cover film 130 is provided after an adhesive has been applied to the base film 110. Thereafter, the insulating reinforcing film 150 is bonded onto the predetermined area of the base film 110. Then, the crimp terminals 200 are attached to the FPC 100 in such a manner that the multiple crimp pieces 221, 222 of the crimp terminals 200 are swaged to the area of the base film 110 where the insulating reinforcing film 150 is provided. It can be said that in the terminal-equipped FPC 10 manufactured as described above, the insulating reinforcing film 150 is partially integrally provided on the area of the base film 110 where the multiple crimp pieces 221, 222 penetrate.

<Advantages of Crimp Terminal-Equipped Flexible Printed Circuit Board According to Present Embodiment>

According to the terminal-equipped FPC 10 of the present embodiment, the insulating reinforcing film 150 is integrally provided on the base film 110. With this configuration, the stiffness of a location of the FPC 100 where the insulating reinforcing film 150 is provided can be enhanced. Moreover, the crimp terminals 200 are attached to the location of the FPC 100 where the insulating reinforcing film 150 is provided. Thus, in the vicinity of the crimp pieces 221, 222 in the FPC 100, the strength of the FPC 100 and the crimp terminals 200 can be enhanced, and deformation thereof can be reduced. Consequently, stable electrical connection can be made. The insulating reinforcing film 150 is partially provided, and therefore, an increase in the weight of the FPC 100 can be suppressed, and degradation of the bendability of the FPC 100 can be also reduced. Note that according to the terminal-equipped FPC 10 of the present embodiment, the structure of the crimp terminal 200 does not need to be a complicated structure as in a technique disclosed in Japanese Patent No. 4889027 or Japanese Patent No. 5465579. Thus, the terminal-equipped FPC 10 according to the present embodiment can be applied to a wide variety of types of connectors, can be highly versatile, and can suppress a cost increase.

Second Embodiment

FIGS. 4A, 4B, 5A, and 5B show a second embodiment of the present disclosure. In the configuration described in the first embodiment, the crimp terminals are attached to the FPC such that the crimp pieces pierce the FPC from the insulating reinforcing film side to the cover film side. On the other hand, in a configuration described in the present embodiment, crimp terminals are attached to an FPC such that crimp pieces pierce the FPC from a cover film side to an insulating reinforcing film side. The configuration of the FPC itself and the configuration of the crimp terminal itself are the same as those of the first embodiment, and therefore, the same reference numerals are used to represent the same components and description thereof will be omitted as necessary.

Figure 4A:
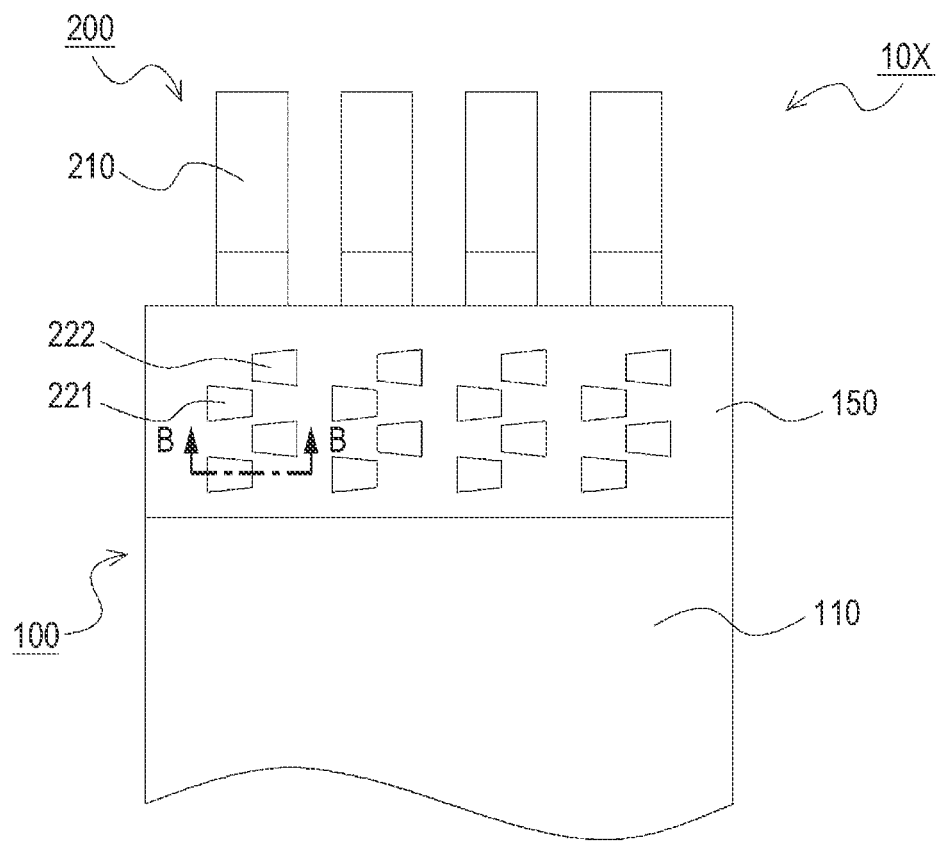
FIGS. 4A and 4B are schematic views of the configuration of a crimp terminal-equipped flexible printed circuit board according to a second embodiment of the present disclosure.
Figure 4B:
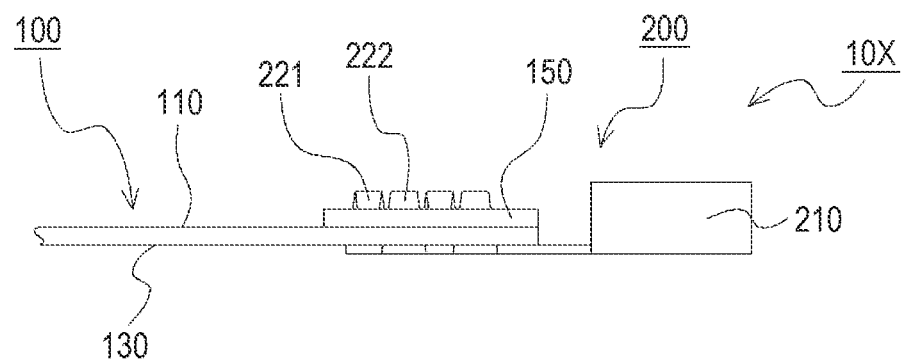
Figure 5A:
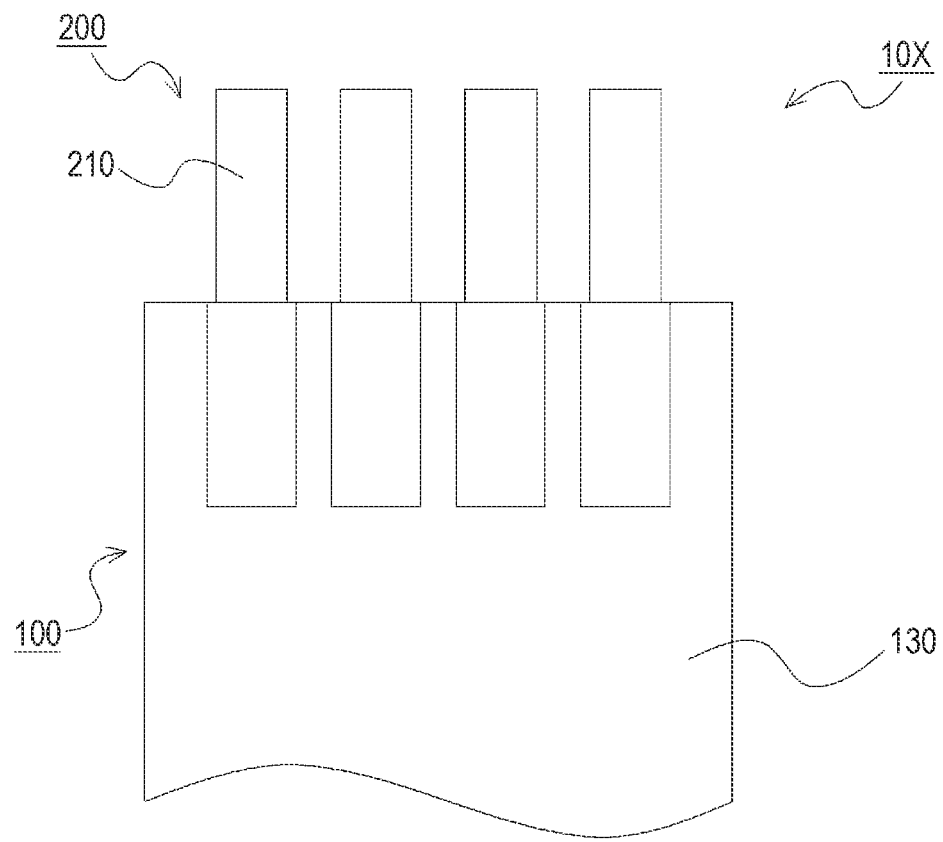
FIGS. 5A and 5B are schematic views of the configuration of the crimp terminal-equipped flexible printed circuit board according to the second embodiment of the present disclosure.
Figure 5B:
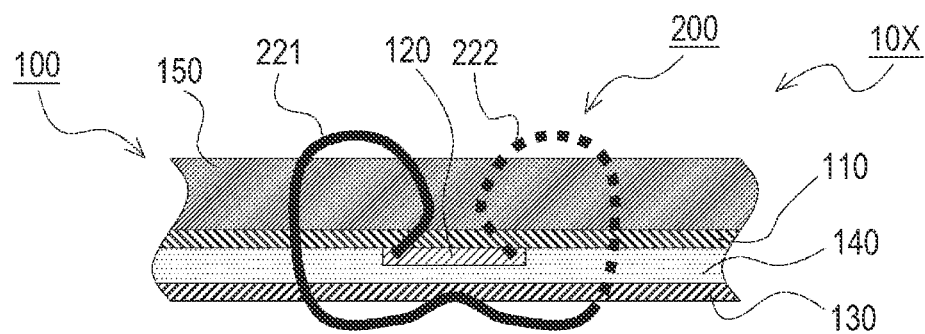

FIGS. 4A and 4B are schematic views of the configuration of the crimp terminal-equipped flexible printed circuit board according to the second embodiment of the present disclosure. FIG. 4A shows part of a back view of the crimp terminal-equipped flexible printed circuit board. FIG. 4B shows part of a side view of the crimp terminal-equipped flexible printed circuit board. FIGS. 5A and 5B are schematic views of the configuration of the crimp terminal-equipped flexible printed circuit board according to the second embodiment of the present disclosure. FIG. 5A shows part of a plan view of the crimp terminal-equipped flexible printed circuit board. FIG. 5B is a schematic sectional view of the crimp terminal-equipped flexible printed circuit board, and is a sectional view (not showing box portions of the crimp terminals) along a BB line in FIG. 4A.

The configuration of the crimp terminal-equipped flexible printed circuit board (hereinafter referred to as a "terminal-equipped FPC 10X" as necessary) according to the present embodiment will be described. The terminal-equipped FPC 10X includes a flexible printed circuit board (equivalent to a first flexible printed circuit board, and hereinafter referred to as an "FPC 100") and crimp terminals 200 attached to the FPC 100. The configuration of the FPC 100 itself and the configuration of the crimp terminal 200 itself are as described in the first embodiment.

In the present embodiment, the crimp terminals 200 are attached to the FPC 100 such that crimp pieces 221, 222 pierce the FPC 100 from a cover film 130 side to an insulating reinforcing film 150 side. Note that the method for manufacturing the terminal-equipped FPC 10X according to the present embodiment is also similar to that of the first embodiment.

With the terminal-equipped FPC 10X of the present embodiment configured as described above, advantageous effects similar to those of the first embodiment can be obtained.

Third Embodiment

FIGS. 6A, 6B, 7A, and 7B show a third embodiment of the present disclosure. In the configurations described in the first and second embodiments, the cover film is entirely provided on the opposite side of the circuit from the base film in the FPC. On the other hand, in a configuration described in the present embodiment, no cover film is provided on the area of an FPC where crimp terminals are provided. Other basic configurations are the same as those of the first embodiment, and therefore, the same reference numerals are used to represent the same components and description thereof will be omitted as necessary.

Figure 6A:
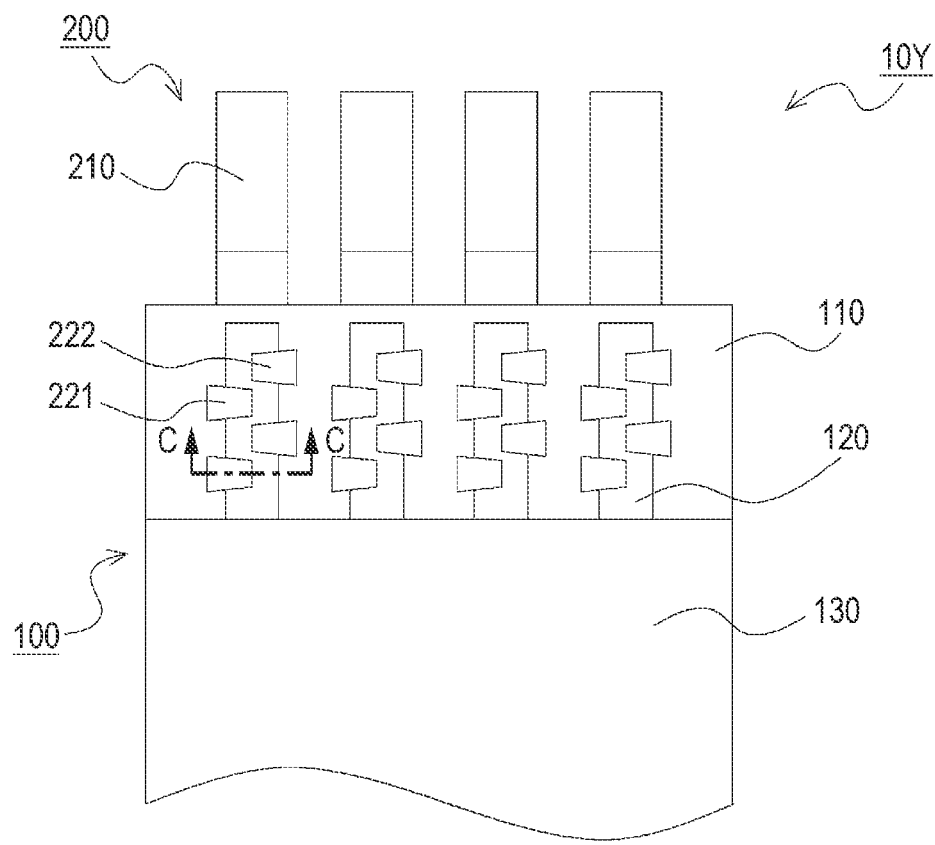
FIGS. 6A and 6B are schematic views of the configuration of a crimp terminal-equipped flexible printed circuit board according to a third embodiment of the present disclosure.
Figure 6B:
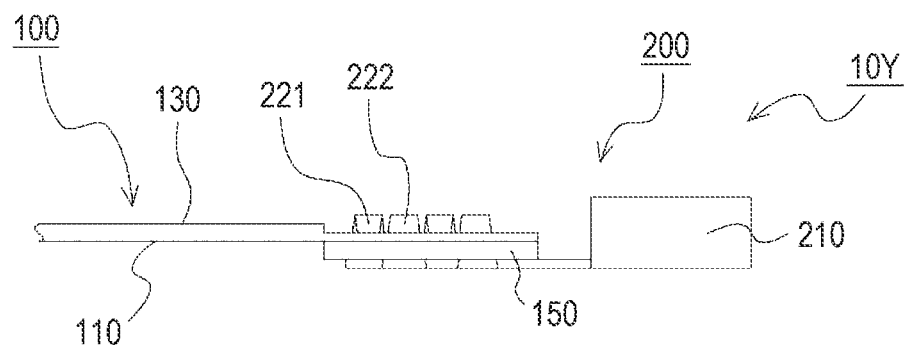
Figure 7A:
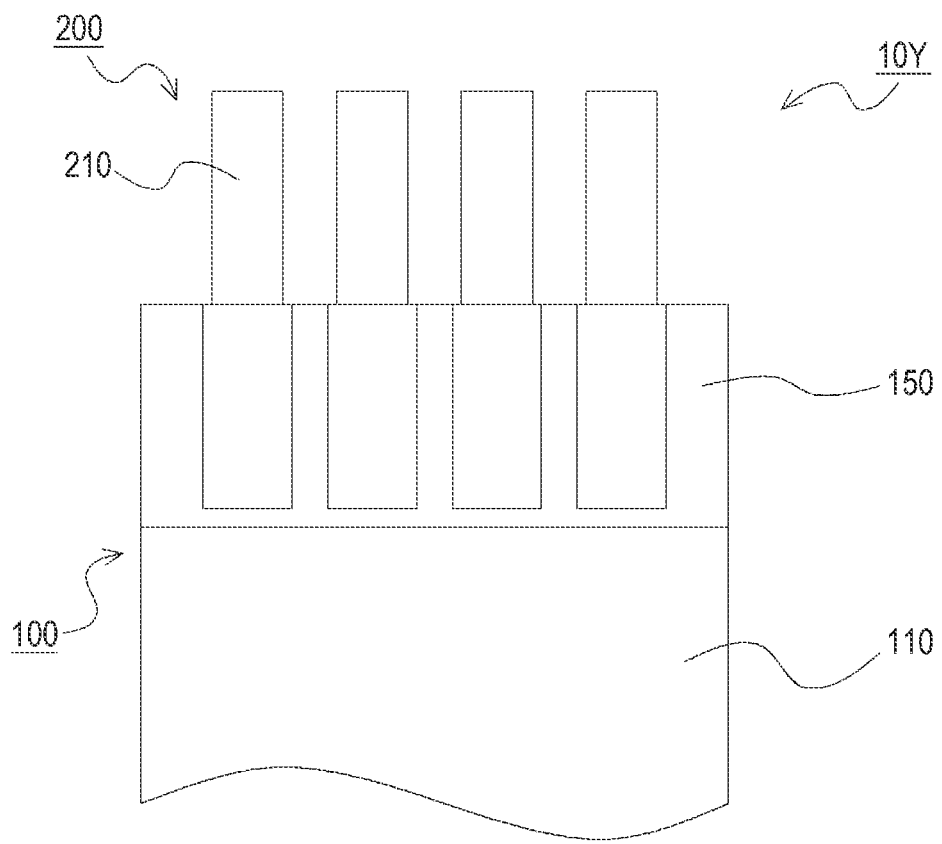
FIGS. 7A and 7B are schematic views of the configuration of the crimp terminal-equipped flexible printed circuit board according to the third embodiment of the present disclosure.
Figure 7B:
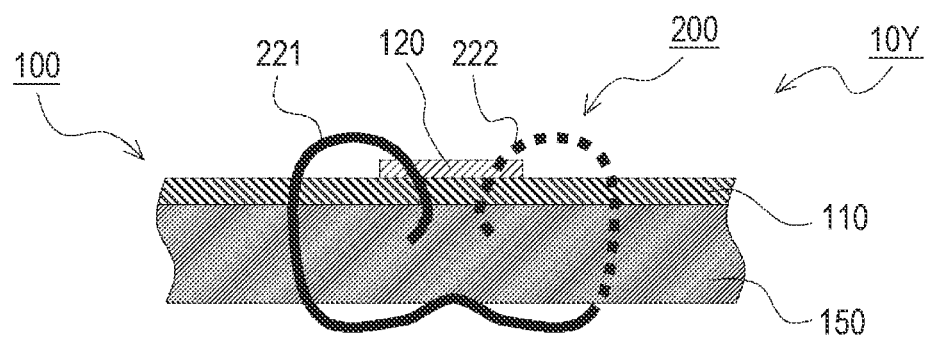

FIGS. 6A and 6B are schematic views of the configuration of the crimp terminal-equipped flexible printed circuit board according to the third embodiment of the present disclosure. FIG. 6A shows part of a plan view of the crimp terminal-equipped flexible printed circuit hoard. FIG. 6B shows part of a side view of the crimp terminal-equipped flexible printed circuit board. FIGS. 7A and 7B are schematic views of the configuration of the crimp terminal-equipped flexible printed circuit board according to the third embodiment of the present disclosure, FIG. 7A shows part of a back view of the crimp terminal-equipped flexible printed circuit board. FIG. 7B is a schematic sectional view of the crimp terminal-equipped flexible printed circuit board, and is a sectional view (not showing box portion of the crimp terminals) along a CC line in FIG. 6A.

The configuration of the crimp terminal-equipped flexible printed circuit board (hereinafter referred to as a "terminal-equipped FPC 10Y" as necessary) according to the present embodiment will be described. The terminal-equipped FPC 10Y includes a flexible printed circuit board (equivalent to a first flexible printed circuit board, and hereinafter referred to as an "FPC 100") and crimp terminals 200 attached to the FPC 100. The configuration of the crimp terminal 200 is as described in the first embodiment.

The FPC 100 has a base film 110, a circuit 120 provided on a surface of the base film 110 and made of metal foil (e.g., copper foil), and a cover film 130 bonded to the base film 110 to sandwich the circuit 120. Note that an adhesive layer 140 for bonding the base film 110 and the cover film 130 to each other is firmed between these films.

The FPC 100 according to the present embodiment includes an insulating reinforcing film 150. The insulating reinforcing film 150 is partially integrally provided on a predetermined area of the base film 110. The base film 110 is, for example, made of polyimide, polyethylene naphthalate, or polyethylene terephthalate. The FPC 100 configured as described above is called a single-sided copper-clad laminate in a case where the circuit 120 is made of copper foil. Moreover, in a partial area of the FPC 100 according to the present embodiment, part of the circuit 120 is exposed without the cover film 130 being provided.

Crimp pieces 221, 222 of the crimp terminal 200 are crimped to penetrate the FPC 100 and bent to bite into part of the circuit 120. In the present embodiment, no cover film 130 is provided in the area of the FPC 100 where the crimp pieces 221, 222 are crimped. Moreover, in the present embodiment, the crimp terminal 200 is attached to the FPC 100 such that the crimp pieces 221, 222 pierce the FPC 100 from an insulating reinforcing film 150 side to a base film 110 side.

Note that in the present embodiment, various well-known crimp terminals each including the crimp pieces 221, 222 as described above can be employed as the crimp terminal 200. Moreover, in the present embodiment, a case where the crimp terminal is a female terminal is described. On this point, the crimp terminal in the embodiment of the present disclosure can be also applied to a male terminal including similar crimp pieces. Moreover, the method for manufacturing the terminal-equipped FPC 10Y according to the present embodiment is similar to that of the first embodiment.

With the terminal-equipped FPC 10Y of the present embodiment configured as described above, advantageous effects similar to those of the first embodiment can be also obtained. Moreover, according to the terminal-equipped FPC 10Y of the present embodiment, all of the crimp pieces 221, 222 are configured to bite into the exposed part of the circuit 120 without penetrating the cover film 130, Thus, the area of contact between the crimp piece 221, 222 and the circuit 120 can be expanded. That is, in a case where the crimp pieces 221, 222 bite into part of the circuit 120 in a state in which the crimp pieces 221, 222 penetrate the cover film 130, part of the cover film 130 easily enters the vicinity of a connection portion between the crimp piece 221, 222 and the circuit 120. For this reason, the area of contact between the crimp piece 221, 222 and the circuit 120 tends to be small. On the other hand, by employing the configuration in which the crimp pieces 221, 222 bite into the exposed part of the circuit 120, the area of contact between the crimp piece 221, 222 and the circuit 120 can be expanded. Thus, electrical connection can be much more stably made. Moreover, the base film 110 and the insulating reinforcing film 150 are provided at crimped portions, and therefore, the strength thereof is also ensured. Thus, the stable electrical connection can be made while the strength is held.

Note that in the configuration described in the present embodiment, all of the crimp pieces 221, 222 bite into the exposed part of the circuit 120 without penetrating the cover film 130. However, the area of the FPC 100 where no cover film 130 is provided may be set such that some of the crimp pieces 221, 222 penetrate the cover film 130. That is, arrangement of the crimp pieces in the area where the circuit 120 is exposed and the crimp pieces in the area where the cover film 130 is provided may be set according to, e.g., use environment, considering balance between the strength and the electrical connection stability.

Fourth Embodiment

FIGS. 8A, 8B, 9A, and 9B show a fourth embodiment of the present disclosure. In the configuration described in the third embodiment, the crimp terminals are attached to the FPC such that the crimp pieces pierce the FPC from the insulating reinforcing film side to the base film side. On the other hand, in a configuration described in the present embodiment, crimp terminals are attached to an FPC such that crimp pieces pierce the FPC from a base film side to an insulating reinforcing film side. The configuration of the FPC itself is the same as that of the third embodiment, and the configuration of the crimp terminal itself is the same as that of the first embodiment. Thus, the same reference numerals are used to represent the same components, and description thereof will be omitted as necessary.

Figure 8A:
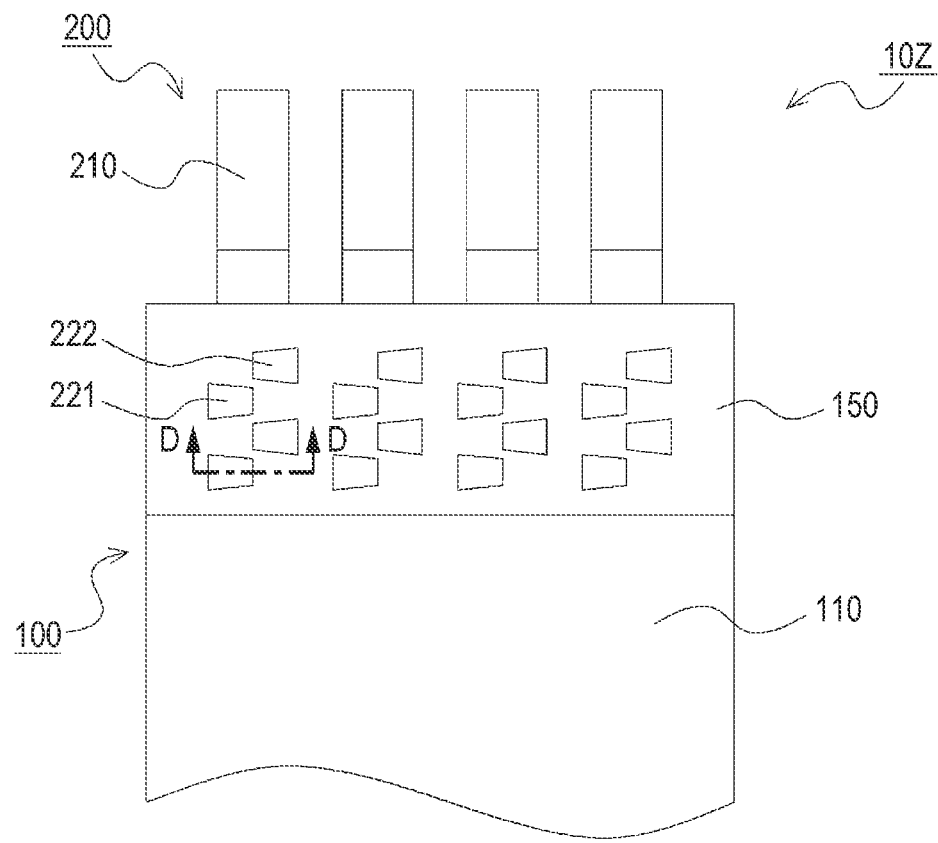
FIGS. 8A and 8B are schematic views of the configuration of a crimp terminal-equipped flexible printed circuit board according to a fourth embodiment of the present disclosure.
Figure 8B:
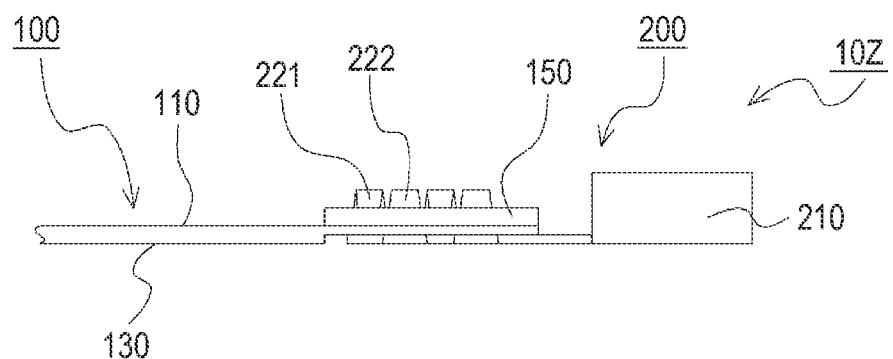
Figure 9A:
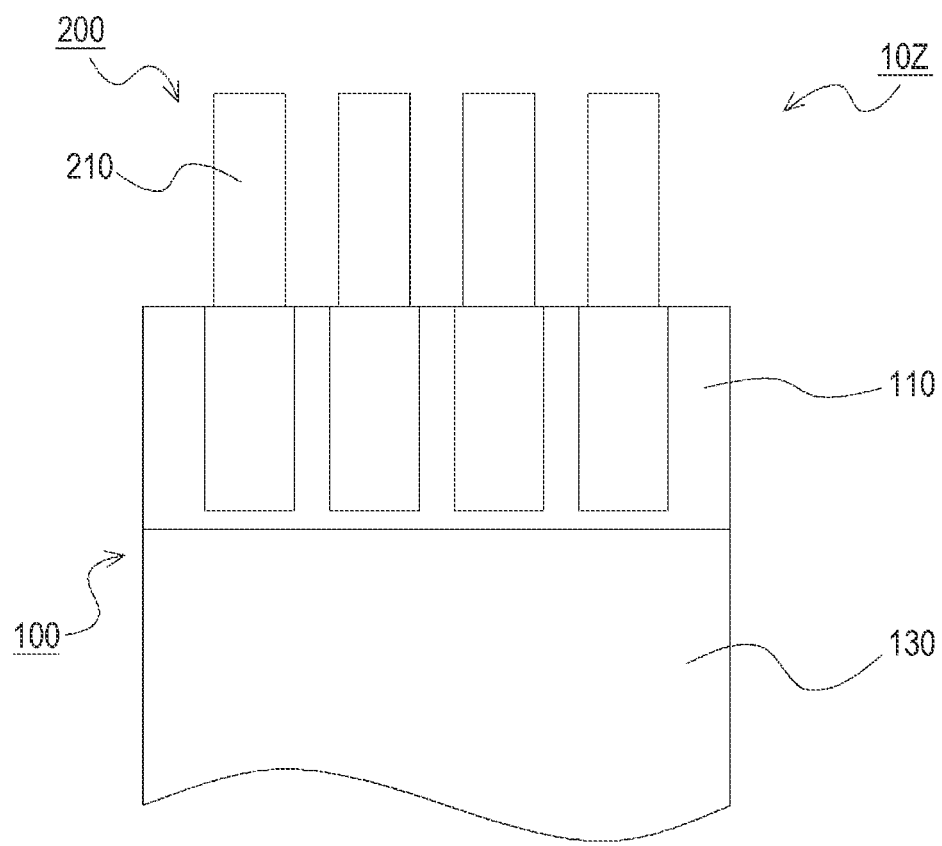
FIGS. 9A and 9B are schematic views of the configuration of the crimp terminal-equipped flexible printed circuit board according to the fourth embodiment of the present disclosure.
Figure 9B:
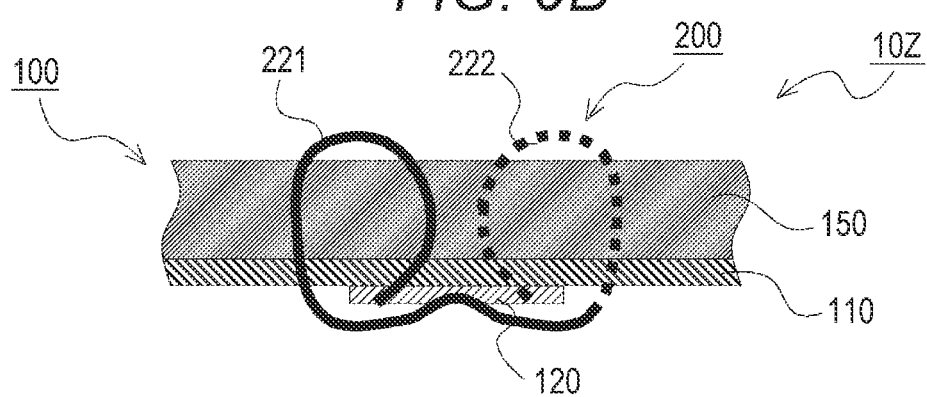

FIGS. 8A and 8B are schematic views of the configuration of the crimp terminal-equipped flexible printed circuit board according to the fourth embodiment of the present disclosure. FIG. 8A shows part of a back view of the crimp terminal-equipped flexible printed circuit hoard. FIG. 8B shows part of a side view of the crimp terminal-equipped flexible printed circuit board. FIGS. 9A and 9B are schematic views of the configuration of the crimp terminal-equipped flexible printed circuit board according to the fourth embodiment of the present disclosure. FIG. 9A shows part of a plan view of the crimp terminal-equipped flexible printed circuit board. FIG. 9B is a schematic sectional view of the crimp terminal-equipped flexible printed circuit board, and is a sectional view (not showing box portions of the crimp terminals) along a DD line in FIG. 8A.

The configuration of the crimp terminal-equipped flexible printed circuit hoard (hereinafter referred to as a "terminal-equipped FPC 10Z" as necessary) according to the present embodiment will be described. The terminal-equipped FPC 10Z includes a flexible printed circuit board (equivalent to a first flexible printed circuit board, and hereinafter referred to as an "FPC 100") and crimp terminals 200 attached to the FPC 100. The configuration of the FPC 100 itself is as described in the third embodiment, and the configuration of the crimp terminal 200 itself is as described in the first embodiment.

In the present embodiment, the crimp terminals 200 are attached to the FPC 100 such that crimp pieces 221, 222 pierce the FPC 100 from a base film 110 side to an insulating reinforcing film 150 side. Note that the method for manufacturing the terminal-equipped FPC 10Z according to the present embodiment is also similar to that of the first embodiment.

With the terminal-equipped FPC 10Z of the present embodiment configured as described above, advantageous effects similar to those of the third embodiment can be obtained. Note that as in the third embodiment, the area of the FPC 100 where no cover film 130 is provided may be set such that some of the crimp pieces 221, 222 penetrate the cover film 130.

The crimp terminal-equipped flexible printed circuit board according to each embodiment of the present disclosure may be configured as follows. That is, the crimp terminal-equipped flexible printed circuit board is a crimp terminal-equipped flexible printed circuit board including a flexible printed circuit board (a first flexible printed circuit board) having a base film and a circuit provided on a surface of the base film and made of metal foil and multiple crimp terminals having crimp pieces crimped to penetrate the flexible printed circuit board and bent to bite into part of the circuit, an insulating reinforcing film being partially integrally provided on the area of the base film where the multiple crimp pieces penetrate.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A crimp terminal-equipped flexible printed circuit board comprising:
   a first flexible printed circuit board having a base film and a circuit provided on a surface of the base film and made of metal foil;
   crimp terminals including multiple crimp pieces crimped to penetrate the first flexible printed circuit board in a thickness direction of the first flexible printed circuit board and bent to bite into part of the circuit; and
   an insulating reinforcing film partially integrally provided on an area of the base film where the multiple crimp pieces penetrate, wherein
      the multiple crimp pieces penetrate the insulating reinforcing film in the thickness direction.

2. The crimp terminal-equipped flexible printed circuit board according to claim 1, wherein
   the base film of the first flexible printed circuit board is a single-sided copper-clad laminate made of polyimide, polyethylene naphthalate, or polyethylene terephthalate.

3. The crimp terminal-equipped flexible printed circuit board according to claim 1, wherein
   the first flexible printed circuit board has a cover film bonded to the base film to sandwich the circuit,
   in a partial area of the first flexible printed circuit board, part of the circuit is exposed without the cover film being provided, and
   in the partial area, at least some of the multiple crimp pieces bite into the part of the circuit without penetrating the cover film.

4. The crimp terminal-equipped flexible printed circuit board according to claim 2, wherein
   the first flexible printed circuit board has a cover film bonded to the base film to sandwich the circuit,
   in a partial area of the first flexible printed circuit board, part of the circuit is exposed without the cover film being provided, and
   in the partial area, at least some of the multiple crimp pieces bite into the part of the circuit without penetrating the cover film.

5. A method for manufacturing a crimp terminal-equipped flexible printed circuit board, comprising:
   bonding an insulating reinforcing film to a predetermined area of a base film included in a first flexible printed circuit board; and
   swaging multiple crimp pieces included in crimp terminals to an area where the insulating reinforcing film is provided, thereby attaching the crimp terminals to the first flexible printed circuit board, wherein
      the multiple crimp pieces penetrate the first flexible printed circuit board and the insulating reinforcing film in a thickness direction of the first flexible printed circuit board.

* * * * *